United States Patent
Zhao et al.

(10) Patent No.: US 10,901,048 B2
(45) Date of Patent: Jan. 26, 2021

(54) ELECTRONIC MAGNETOMETER AND METHOD FOR MEASURING MAGNETIC FIELD

(71) Applicant: INSTITUTE OF GEOLOGY AND GEOPHYSICS CHINESE ACADEMY OF SCIENCES (IGGCAS), Beijing (CN)

(72) Inventors: Lin Zhao, Beijing (CN); Aimin Du, Beijing (CN); Shuquan Sun, Beijing (CN); Heng Tang, Beijing (CN); Qiong Li, Beijing (CN); Xiao Feng, Beijing (CN); Cuihong Li, Beijing (CN); Qingyun Di, Beijing (CN)

(73) Assignee: INSTITUTE OF GEOLOGY AND GEOPHYSICS CHINESE ACADEMY OF SCIENCES (IGGCAS), Beijing (CN)

( * ) Notice: Subject to any disclaimer, the term of this patent is extended or adjusted under 35 U.S.C. 154(b) by 0 days.

(21) Appl. No.: 15/909,591

(22) Filed: Mar. 1, 2018

(65) Prior Publication Data

US 2018/0188337 A1    Jul. 5, 2018

Related U.S. Application Data

(63) Continuation of application No. PCT/CN2016/071031, filed on Jan. 15, 2016.

(30) Foreign Application Priority Data

Jan. 7, 2016  (CN) .......................... 2016 1 0008534

(51) Int. Cl.
*G01R 33/028*  (2006.01)
*G01R 23/10*  (2006.01)
(Continued)

(52) U.S. Cl.
CPC ........... *G01R 33/028* (2013.01); *G01R 23/10* (2013.01); *G01R 33/0076* (2013.01); *G01R 33/06* (2013.01); *G01V 3/40* (2013.01)

(58) Field of Classification Search
CPC ........ H01L 47/02; G01R 33/028; G01R 23/10
See application file for complete search history.

(56) References Cited

U.S. PATENT DOCUMENTS 3,404,332 A     10/1968  Abragam
3,796,969 A  *  3/1974   Bosch ..................... H01L 23/66
                                                     332/130

(Continued)

FOREIGN PATENT DOCUMENTS

CN    104597418 A    5/2015
CN    105572607 A    5/2016

*Primary Examiner* — Reena Aurora
(74) *Attorney, Agent, or Firm* — Hemisphere Law, PLLC; Zhigang Ma

(57) ABSTRACT

An electronic magnetometer and a method for measuring a magnetic field are provided. A Gunn diode with magnetic shielding and a Gunn diode without magnetic shielding generate different induced high-frequency oscillating currents in various environments. The high-frequency oscillating current of the Gunn diode with magnetic shielding and the high-frequency oscillating current of the Gunn diode without magnetic shielding are processed by circuits and subsequently compared. The difference of frequencies in the two currents is proportional to the magnitude of magnetic field, and the magnitude of magnetic field is obtained.

3 Claims, 1 Drawing Sheet

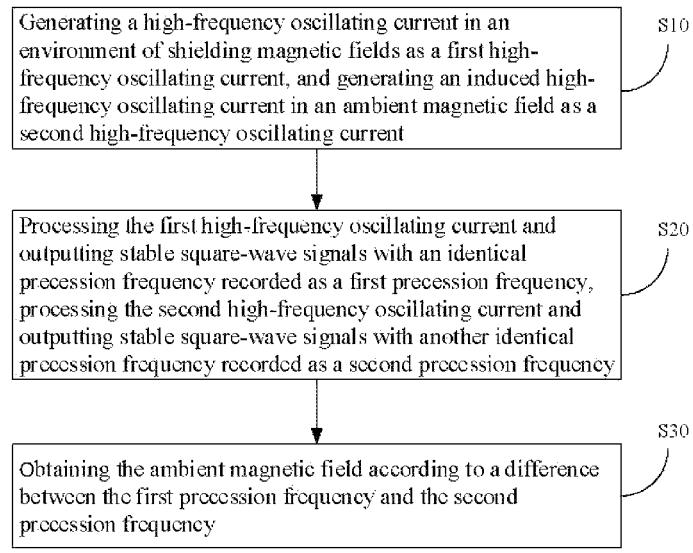

(51) Int. Cl.
*G01V 3/40* (2006.01)
*G01R 33/06* (2006.01)
*G01R 33/00* (2006.01)

(56) References Cited

U.S. PATENT DOCUMENTS

| | | | |
|---|---|---|---|
| 5,600,253 A | | 2/1997 | Cohen et al. |
| 6,653,831 B2* | | 11/2003 | Friend .................. G01C 17/30 324/244 |
| 2015/0115938 A1* | | 4/2015 | Kasajima ........... G01R 33/0041 324/207.18 |

* cited by examiner

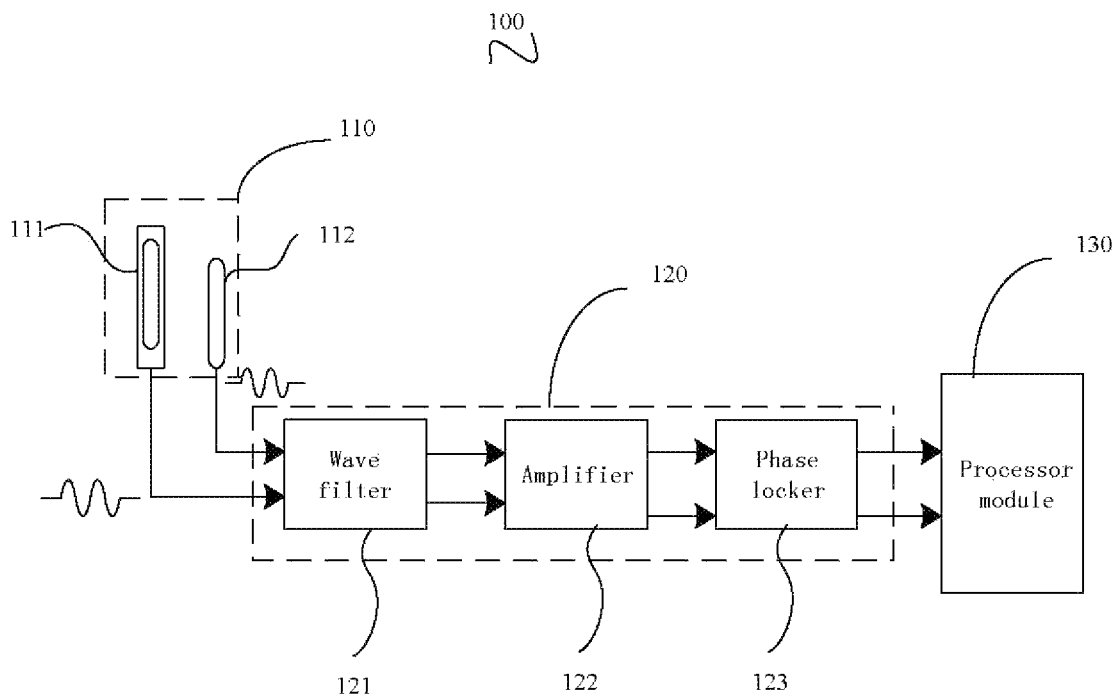

FIG. 1

Generating a high-frequency oscillating current in an environment of shielding magnetic fields as a first high-frequency oscillating current, and generating an induced high-frequency oscillating current in an ambient magnetic field as a second high-frequency oscillating current — S10

Processing the first high-frequency oscillating current and outputting stable square-wave signals with an identical precession frequency recorded as a first precession frequency, processing the second high-frequency oscillating current and outputting stable square-wave signals with another identical precession frequency recorded as a second precession frequency — S20

Obtaining the ambient magnetic field according to a difference between the first precession frequency and the second precession frequency — S30

FIG. 2

ELECTRONIC MAGNETOMETER AND METHOD FOR MEASURING MAGNETIC FIELD

FIELD OF THE DISCLOSURE

The disclosure relates to a geomagnetic field measurement technical field, and more particularly to an electronic magnetometer and a method for measuring a magnetic field.

BACKGROUND

The magnetic field is a fundamental characteristic of celestial bodies in the universe. The geomagnetic field is a magnetic field of the earth. A geomagnetic field strength at any position around the earth is a vector with certain value and direction, and magnetic field strengths at various positions around the earth are generally supposed to be different. From the aspect of mathematic model, magnetic fields of the earth satisfy the Laplace's equation. As a result, the magnetic field at any position of the terrestrial surface, especially the space lower than 1000 km from the earth, can be obtained by utilizing the Laplace's equation to process several measured geomagnetic fields at some random positions.

Nowadays, regularly high-sensitive magnetic sensors primarily have a fluxgate sensor, an optical pump magnetometer and a SQUID magnetometer. The fluxgate sensor employs the magnetic saturation principle of soft magnetic materials to measure vectors of magnetic fields, and the resolution can be up to 0.01 nT, but the stability is poor with the presence of zero drift, for which can hardly be applied in the absolute measurement. The optical pump magnetometer adopts the linear relation of the magnetic field strength and the atomic absorption spectrum to measure the total strength of the magnetic field, and its measuring range is 20000-100000 nT, which cannot be used for measuring weak magnetic fields, and the angle between the direction of the probe and the magnetic field is required to be within a certain range due to the blind angle existed in measuring directions. The SQUID magnetometer is the most sensitive magnetic sensor at present, which is widely applied in measuring weak and high-resolution magnetic fields in a laboratory. The SQUID magnetometer utilizes the Joseph effect to measure the total strength and vector of the magnetic field, and the sensitivity can be up to 1 pT, which usually works in the environment of liquid helium, thereby to be restricted to be used in the laboratory. The power consumption of the three magnetic sensors above is several watts or dozens of watts, and the weights are from several kilograms to dozens of kilograms.

The Gunn effect depicts a negative differential resistance effect formed due to electrons transferred among energy valleys in a homogenous momomorph material. The energy band structure of the material with the negative differential resistance effect caused by the electron transfer is a direct band gap, and the conduction band has two or more than two energy valleys. The dipole domain generated by the energy valley under an external electric field grows to be mature, and simultaneously moves toward the anode attracted by the electric field. The domain is absorbed to form the peak current after reaching the anode. The sample is recovered to repeat the pervious process to form the stable high-frequency oscillating current. The electron trajectory and migration time are changed by the influence of the magnetic field, and the frequency of the high-frequency oscillating current is consequently changed. An electronic magnetometer is invented based on the principle to measure magnetic fields, which is lack in practice to utilize the Gunn effect in a magnetometer.

SUMMARY

The disclosure provides an electronic magnetometer with stable performance and a method to measure a magnetic field.

An electronic magnetometer includes a magnetic sensor, a circuit processing module and a processor module.

The magnetic sensor includes of a Gunn diode with magnetic shielding and a Gunn diode without magnetic shielding. The magnetic sensor is configured for generating an induced high-frequency oscillating current by the Gunn diode with magnetic shielding in an environment of shielding magnetic fields as a first high-frequency oscillating current and outputting the first high-frequency oscillating current to the circuit processing module, and the magnetic sensor is further configured for generating an induced high-frequency oscillating current generated by the Gunn diode without magnetic shielding in an ambient magnetic field as a second high-frequency oscillating current and outputting the second high-frequency oscillating current to the circuit processing module.

The circuit processing module processes the first high-frequency oscillating current, and outputs stable square-wave signals with an identical precession frequency recorded as a first precession frequency to the processor module.

The circuit processing module further processes the second high-frequency oscillating current, and outputs stable square-wave signals with another identical precession frequency recorded as a second precession frequency to the processor module.

The processor module obtains the ambient magnetic field according to a difference between the first precession frequency and the second precession frequency.

In some embodiments, the circuit processing module includes a wave filter, an amplifier and a phase locker.

The wave filter is configured for filtering noisy frequencies in the first high-frequency oscillating current and the second high-frequency oscillating current.

The amplifier is configured for amplifying signals of the first high-frequency oscillating current and the second high-frequency oscillating current.

The phase locker is configured for locking oscillation frequencies of the first high-frequency oscillating current and the second high-frequency oscillating current.

Additionally, the disclosure further provides a method for measuring a magnetic field, including following steps: generating a high-frequency oscillating current in an environment of shielding magnetic fields as a first high-frequency oscillating current, and generating an induced high-frequency oscillating current in an ambient magnetic field as a second high-frequency oscillating current, processing the first high-frequency oscillating current and outputting stable square-wave signals with an identical precession frequency recorded as a first precession frequency, processing the second high-frequency oscillating current and outputting stable square-wave signals with another identical precession frequency recorded as a second precession frequency, obtaining the ambient magnetic field according to a difference between the first precession frequency and the second precession frequency.

According to the electronic magnetometer and the method to measure the magnetic field provided by the disclosure, the Gunn diode with magnetic shielding and the Gunn diode without magnetic shielding generate induced high-frequency oscillating currents in different environments. The high-frequency oscillating current of the Gunn diode with magnetic shielding and the high-frequency oscillating current of the Gunn diode without magnetic shielding are processed by circuits and subsequently compared. The difference of frequencies in the two currents is proportional to the magnitude of magnetic field, and the magnitude of magnetic field can be obtained.

BRIEF DESCRIPTION OF THE DRAWINGS

FIG. 1 is a block diagram of modules of an electronic magnetometer of the disclosure;

FIG. 2 is a flowchart of a method for measuring a magnetic field of the disclosure.

DETAILED DESCRIPTION OF PREFERRED EMBODIMENTS

The disclosure will be further illustrated in detail with reference to concrete embodiments and accompanying drawings as follows.

Referring to FIG. 1, an electronic magnetometer provided by the disclosure includes: a magnetic sensor 110, a circuit processing module 120 and a processor module 130.

The magnetic sensor 110 consists of a Gunn diode 111 with magnetic shielding and a Gunn diode 112 without magnetic shielding. The magnetic sensor is configured for generating an induced high-frequency oscillating current by the Gunn diode 111 with magnetic shielding in an environment of shielding magnetic fields as a first high-frequency oscillating current and outputting the first high-frequency oscillating current to the circuit processing module 120, and the magnetic sensor is further configured for generating an induced high-frequency oscillating current by the Gunn diode 112 without magnetic shielding in an ambient magnetic field as a second high-frequency oscillating current and outputting the second high-frequency oscillating current to the circuit processing module 120.

The circuit processing module 120 processes the first high-frequency oscillating current, and outputs stable square-wave signals with an identical precession frequency recorded as a first precession frequency to the processor module 130.

The circuit processing module 120 further processes the second high-frequency oscillating current, and outputs stable square-wave signals with another identical precession frequency recorded as a second precession frequency to the processor module 130.

Preferably, the circuit processing module 120 includes a wave filter 121, an amplifier 122 and a phase locker 123.

The wave filter 121 is configured for filtering noisy frequencies in the first high-frequency oscillating current and the second high-frequency oscillating current.

The amplifier 122 is configured for amplifying signals of the first high-frequency oscillating current and the second high-frequency oscillating current.

The phase locker 123 is configured for locking oscillation frequencies of the first high-frequency oscillating current and the second high-frequency oscillating current.

The processor module 130 obtains the ambient magnetic field according to the difference between the first precession frequency and the second precession frequency.

Specifically, a transverse magnetic field B is introduced. The oscillation frequency is $$f - \Delta f = \frac{1}{\tau + \Delta \tau} = \frac{1}{\tau}\left(1 + \frac{\Delta \tau}{\tau}\right)^{-1} \approx f\left(1 - \frac{\Delta \tau}{\tau}\right) = f(1 - f\Delta \tau) = f - f^2 \Delta n \tau_0 \quad (1)$$

Where $\tau$ is the time for electrons whose length of Gunn domain is L to migrate in the diode without applying external magnetic fields, and $\tau_0$ is the migration time of the mean free path of an electron. f is the first precession frequency, and $\Delta f$ is the difference between the second precession frequency and the first precession frequency. n is an intermediate variable, which is meaningless in practice.

$$\tau_0 = \tau/n = 1/nf \quad (2)$$

In that way, $$\Delta f = f^2 \Delta n \tau_0 = f\frac{\Delta L}{L} \quad (3)$$

The deviation angle of the electronic orbit caused by introducing the weak magnetic field B is $\varphi$, and the transverse migration of electrons in the Gunn diode is $\xi$.

$$\Delta L = \xi \sin \varphi = \xi^2/L \quad (4)$$

The value of $\xi$ can be obtained by inversely solving the magnetic dynamic equation of drift electrons in the diode in the weak magnetic field B.

$$\xi = Bev/\xi \quad (5)$$

Where $\upsilon$ is the saturation velocity of electrons; e is an electron charge; $\xi$ is a constraint constant, or a variable constant according to the linear movement of electrons from the cathode to the anode affected by the lengthwise direct current electric field.

The relation of the frequency and the magnetic field obtained by combining (3), (4) and (5) is:

$$\Delta f = f\frac{(e\upsilon)^2}{\xi L}B^2$$

Where f is the first precession frequency, and $\Delta f$ is the difference between the second precession frequency and the first precession frequency.

It can be understood that according to the algorithm above, the processor module 130 can achieve the magnitude of magnetic field according to the relation of the difference between the first precession frequency and the second precession frequency and the magnitude of magnetic field.

Referring to FIG. 2, the disclosure further provides a method to measure the magnetic field, including following steps.

Step S10: an induced high-frequency oscillating current in an environment of shielding magnetic fields is recorded as a first high-frequency oscillating current, and an induced high-frequency oscillating current in an ambient magnetic field is recorded as a second high-frequency oscillating current.

Step S20: the first high-frequency oscillating current is processed, and stable square-wave signals with an identical precession frequency are output. The frequency above is recorded as a first precession frequency; the second high-frequency oscillating current is processed and stable square-wave signals with an identical precession frequency are output, and the previous frequency is recorded as a second precession frequency.

Step S30: the ambient magnetic field is obtained according to a difference between the first precession frequency and the second precession frequency.

According to the electronic magnetometer and the method to measure the magnetic field provided by the disclosure, the Gunn diode with magnetic shielding and the Gunn diode without magnetic shielding generate induced high-frequency oscillating currents in different environments. The high-frequency oscillating current of the Gunn diode with magnetic shielding and the high-frequency oscillating current of the Gunn diode without magnetic shielding are processed by circuits and subsequently compared. The difference of frequencies in the two currents is proportional to the magnitude of magnetic field, and the magnitude of magnetic field can be obtained.

It can be understood that a person skilled in the art can achieve other modifications and transformations corresponding to the spirit of the disclosure, and all the modifications and transformations should belong to the protective scope of the claims of the disclosure.

What is claimed is:

1. An electronic magnetometer, comprising a magnetic sensor, a circuit processing module and a processor module,
   wherein the magnetic sensor comprises a gunn diode with magnetic shielding and a gunn diode without magnetic shielding, the magnetic sensor is configured for generating an induced high-frequency oscillating current by the gunn diode with magnetic shielding in an environment of shielding magnetic fields as a first high-frequency oscillating current and outputting the first high-frequency oscillating current to the circuit processing module, and the magnetic sensor is further configured for generating an induced high-frequency oscillating current by the gunn diode without magnetic shielding in an ambient magnetic field as a second high-frequency oscillating current and outputting the second high-frequency oscillating current to the circuit processing module;
   wherein the circuit processing module is configured for processing the first high-frequency oscillating current to output stable square-wave signals with an identical precession frequency recorded as a first precession frequency to the processor module;
   wherein the circuit processing module is further configured for processing the second high-frequency oscillating current to output stable square-wave signals with another identical precession frequency recorded as a second precession frequency to the processor module;
   wherein the processor module is configured for obtaining the ambient magnetic field according to a difference between the first precession frequency and the second precession frequency, by the following process:
   oscillation frequencies associated with a transverse magnetic field B exerted in ambient environment are as follows:

$$f - \Delta f = \frac{1}{\tau + \Delta \tau} = \frac{1}{\tau}\left(1 + \frac{\Delta \tau}{\tau}\right)^{-1} \approx f\left(1 - \frac{\Delta \tau}{\tau}\right) = f(1 - f\Delta t) = f - f^2 \Delta n \tau_0;$$

where $\tau$ is migration time of an electron without applying an external magnetic field, whose Gunn domain length is L in the diode, and $\tau_0$ is migration time of mean free path of the electron, wherein migration time $\tau$ of the electron is considered to consist of n migration times of the mean free path of the electron, f is the first precession frequency, and $\Delta f$ is the difference between the first precession frequency and the second precession frequency;

$\tau_0 = \tau/n = 1/nf$, hence $$\Delta f = f^2 \Delta n \tau_0 = f\frac{\Delta L}{L}$$

a deviation angle of the electronic orbit caused by introducing the weak magnetic field B is $\varphi$, and a transverse migration of the electron in the Gunn diode $\xi$, then we get:

$\Delta L = \xi \sin \varphi = \xi^2/L$ the value of $\xi$ is obtained by inversely solving the magnetic dynamic equation of drift electrons in the diode in the weak magnetic field B:

$\xi = BeV/\varepsilon$ where V is a saturation velocity of the electron; e is an electron charge; $\varepsilon$ is a constraint constant, or a variable constant according to linear movement of the electron from the cathode to the anode affected by the lengthwise direct current electric field;

where relation of the frequencies and the magnetic field obtained by the above formulas is given by the following equation:

$$\Delta f = f\frac{(ev)^2}{(\varepsilon L)^2}B^2$$

where f is the first precession frequency, and $\Delta f$ is the difference between the first precession frequency and the second precession frequency.

2. The electronic magnetometer according to claim 1, wherein the circuit processing module comprises a wave filter, an amplifier and a phase locker;
   wherein the wave filter is configured for filtering noisy frequencies in the first high-frequency oscillating current and the second high-frequency oscillating current;
   wherein the amplifier is configured for amplifying signals of the first high-frequency oscillating current and the second high-frequency oscillating current;
   wherein the phase locker is configured for locking oscillation frequencies of the first high-frequency oscillating current and the second high-frequency oscillating current.

3. A method for measuring a magnetic field using an electronic magnetometer which comprises a magnetic sensor, a circuit processing module and a processor module, the magnetic sensor comprising a gunn diode with magnetic shielding and a gunn diode without magnetic shielding, the method comprising:

generating, by the gunn diode with magnetic shielding of the magnetic sensor, a high-frequency oscillating current in an environment of shielding magnetic fields as a first high-frequency oscillating current, and generating, by the gunn diode without magnetic shielding of the magnetic sensor, an induced high-frequency oscillating current in an ambient magnetic field as a second high-frequency oscillating current;

processing, by the circuit processing module, the first high-frequency oscillating current to output stable square-wave signals with an identical precession frequency recorded as a first precession frequency, and processing, by the circuit processing module, the second high-frequency oscillating current to output stable square-wave signals with another identical precession frequency recorded as a second precession frequency;

obtaining, by the processor module, the ambient magnetic field according to a difference between the first precession frequency and the second precession frequency, by the following process:

oscillation frequencies associated with a transverse magnetic field B exerted in ambient environment are as follows:

$$f - \Delta f = \frac{1}{\tau + \Delta \tau} = \frac{1}{\tau}\left(1 + \frac{\Delta \tau}{\tau}\right)^{-1} \approx f\left(1 - \frac{\Delta \tau}{\tau}\right) = f(1 - f\Delta t) = f - f^2 \Delta n \tau_0;$$

where $\tau$ is migration time of an electron without applying an external magnetic field, whose Gunn domain length is L in the diode, and $\tau_0$ is migration time of mean free path of the electron, wherein migration time $\tau$ of the electron is considered to consist of n migration times of the mean free path of the electron, f is the first precession frequency, and $\Delta f$ is the difference between the first precession frequency and the second precession frequency;

$\tau_0 = \tau/n = 1/nf$, hence $$\Delta f = f^2 \Delta n \tau_0 = f \frac{\Delta L}{L}$$

a deviation angle of the electronic orbit caused by introducing the weak magnetic field B is $\varphi$, and a transverse migration of the electron in the Gunn diode $\xi$, then we get:

$$\Delta L = \xi \sin \varphi = \xi^2/L$$

the value of $\xi$ obtained by inversely solving the magnetic dynamic equation of drift electrons in the diode in the weak magnetic field B:

$$\xi = BeV/\varepsilon$$

where V is a saturation velocity of the electron; e is an electron charge; $\varepsilon$ is a constraint constant, or a variable constant according to linear movement of the electron from the cathode to the anode affected by the lengthwise direct current electric field;

where relation of the frequencies and the magnetic field obtained by the above formulas is given by the following:

$$\Delta f = f \frac{(ev)^2}{(\varepsilon L)^2} B^2$$

where f is the first precession frequency, and $\Delta f$ is the difference between the first precession frequency and the second precession frequency.

\* \* \* \* \*